(12) United States Patent
Yamashita et al.

(10) Patent No.: US 7,498,180 B2
(45) Date of Patent: Mar. 3, 2009

(54) METHOD FOR MANUFACTURING SEMICONDUCTOR DEVICE

(75) Inventors: Eisaku Yamashita, Tokyo (JP); Shigeru Takada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 341 days.

(21) Appl. No.: 11/362,881

(22) Filed: Feb. 28, 2006

(65) Prior Publication Data
US 2006/0220668 A1 Oct. 5, 2006

(30) Foreign Application Priority Data
Mar. 31, 2005 (JP) .............................. 2005-102339

(51) Int. Cl.
*H01L 21/00* (2006.01)
(52) U.S. Cl. .......................................... 438/11; 438/17
(58) Field of Classification Search ............... 438/5–18; 324/765, 755, 158.1
See application file for complete search history.

(56) References Cited

U.S. PATENT DOCUMENTS

| | | | | |
|---|---|---|---|---|
| 6,323,669 B1 * | 11/2001 | Kang | .......................... | 324/765 |
| 6,956,392 B2 * | 10/2005 | Wright | ........................ | 324/760 |
| 6,998,862 B2 * | 2/2006 | Cram | .......................... | 324/755 |
| 7,362,114 B2 * | 4/2008 | Winter et al. | ................ | 324/755 |
| 2002/0196047 A1 * | 12/2002 | Doherty et al. | .............. | 324/765 |
| 2003/0037870 A1 * | 2/2003 | Akram et al. | ............. | 156/272.2 |
| 2003/0215979 A1 * | 11/2003 | Jensen | ......................... | 438/106 |
| 2005/0112936 A1 * | 5/2005 | Blondin et al. | .............. | 439/507 |
| 2006/0024990 A1 * | 2/2006 | Ahmad et al. | .................. | 439/71 |
| 2006/0121763 A1 * | 6/2006 | Chiang et al. | ................ | 439/331 |
| 2006/0208721 A1 * | 9/2006 | Soeta et al. | ............... | 324/158.1 |

FOREIGN PATENT DOCUMENTS

| | | |
|---|---|---|
| JP | 2003-157946 | 5/2003 |
| JP | 2004-152495 | 5/2004 |

* cited by examiner

*Primary Examiner*—Savitri Mulpuri
(74) *Attorney, Agent, or Firm*—Oblon, Spivak, McClelland, Maier & Neustadt, P.C.

(57) ABSTRACT

A burn-in input signal input to a burn-in circuit is delivered to an internal circuit through a selector. In response to a control signal from the burn-in circuit, the selector selects either the burn-in input signal or an input signal for operating the internal circuit. In the burn-in test process, a portion of an output signal is monitored to determine the degree of degradation of the internal circuit.

11 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device that includes a burn-in test step.

2. Background Art

In the burn-in test performed in a semiconductor manufacturing process, the burn-in test device needs to supply electrical signals to the semiconductor device to be tested. Therefore, the burn-in test device is electrically connected to the semiconductor device through a socket (see, e.g., Japanese Laid-Open Patent Publication Nos. 2004-152495 and 2003-157946).

As semiconductor devices have become more sophisticated, the number of their terminal pins has tended to increase, requiring more socket pins. Furthermore, with the increasing integration density of semiconductor devices, the size of the packages has become smaller. Therefore, there has been a need for a technique for miniaturizing the sockets in order to reduce the size and pitch of the leads and solder balls. As a result, the cost of the sockets has increased.

Further, conventional sockets have been adapted to be electrically connected to all terminals of the semiconductor device through their contact pins; they have as many contact pins as there are terminals on the semiconductor device. When the socket is mounted on a burn-in board, the leads of the contact pins are passed through the through-holes of the burn-in board from the top side and then soldered to the rear side. This means that each burn-in board must be manufactured to have through-holes corresponding one-to-one to all contact pins of the socket. On the other hand, as the number of pins in sockets has increased, so has the number of wires connected to them. Furthermore, the reduction in the contact pin pitch has resulted in a great reduction in the distance between the through-holes. These make it difficult to form appropriate wiring on a burn-in board, resulting in an increase in the cost and manufacturing time of the board.

Further, the smaller the solder balls provided on a package, the more distinct the dents left on these solder balls due to their contact with the socket pins. These contact dents often cause a measurement error in the visual inspection process performed before-shipping the product.

BGA packages are likely to suffer these problems, since they have ball terminals. It should be noted that the sockets connected to BGA packages use two types of contact pins: those that maintain contact with a solder ball by exerting a pinching action on it; and those that maintain contact with a solder ball by being pressed against its undersurface. The above contact dent that may cause a measurement error in the visual inspection process is likely to occur especially with sockets using contact pins of the latter type.

SUMMARY OF THE INVENTION

The present invention has been devised in view of the above problems. It is, therefore, an object of the present invention to provide a method for manufacturing a semiconductor device at low cost by reducing the number of contact pins in the sockets and thereby reducing the costs of the sockets and the burn-in board.

Another object of the present invention is to provide a method for manufacturing a semiconductor device in which the contact dents on the solder balls are reduced to reduce measurement errors in the visual inspection process.

According to one aspect of the present invention, in a method for manufacturing a semiconductor device, a semiconductor device, a burn-in test device, and a burn-in board so as to be able to test the semiconductor device by use of the burn-in test device and the burn-in board are arranged. The burn-in board has a first socket having fewer contact pins than there are terminals on the semiconductor device. Some of the terminals are electrically connected to the contact pins. A burn-in input signal from the burn-in test device is supplied to the semiconductor device to perform a burn-in test.

Other objects and advantages of the present invention will become apparent from the following description.

DETAILED DESCRIPTION OF THE PREFERRED EMBODIMENTS

Figure 1:
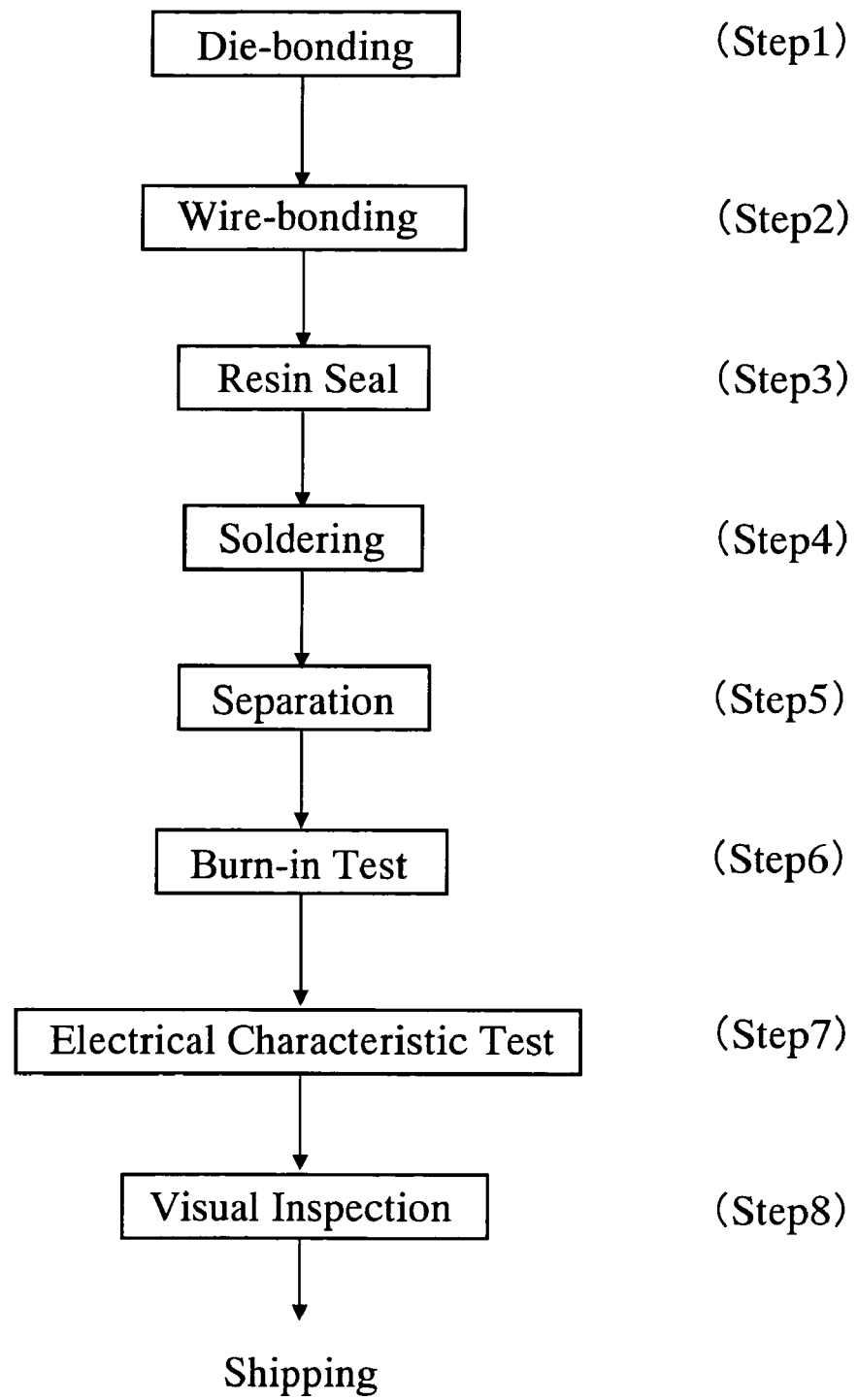
FIG. 1 shows an exemplary semiconductor device manufacturing process according to the present invention.

FIG. 1 is a flowchart showing an exemplary semiconductor device manufacturing process according to an embodiment of the present invention.

First of all, semiconductor chips are die-bonded to a wiring substrate at step 1, and the bonding pads of the semiconductor chips are wire-bonded to the lead electrodes of the wiring substrate at step 2. Then, after the semiconductor chips have been sealed with a resin at step 3, solder balls are formed on the rear surface of the wiring substrate at step 4 and then the individual semiconductor devices (or chips) are separated from each other at step 5. After that, a burn-in test is carried out at step 6.

Figure 2:
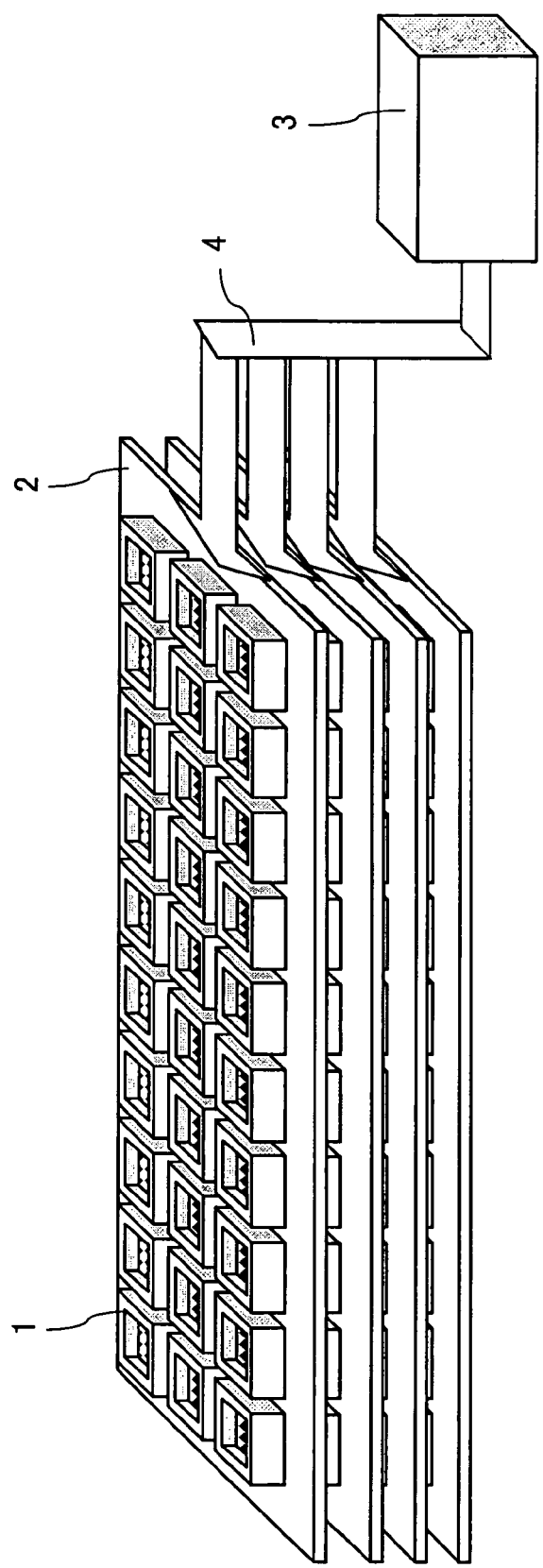
FIG. 2 shows an exemplary burn-in test device applicable to the present embodiment.

FIG. 2 shows an exemplary burn-in test device applicable to the present embodiment. It should be noted that each socket 1 in the figure is a first socket of the present invention.

Referring to FIG. 2, a burn-in input signal 4 is supplied from a burn-in signal generator 3 to a burn-in board 2 having sockets 1 thereon mounted. Therefore, semiconductor devices (not shown) can be subjected to a burn-in test by connecting them to the sockets 1. As shown in the figure, the burn-in test device actually includes a plurality of burn-in boards 2, allowing a large number of semiconductor devices to be inspected at the same time.

Figure 3:
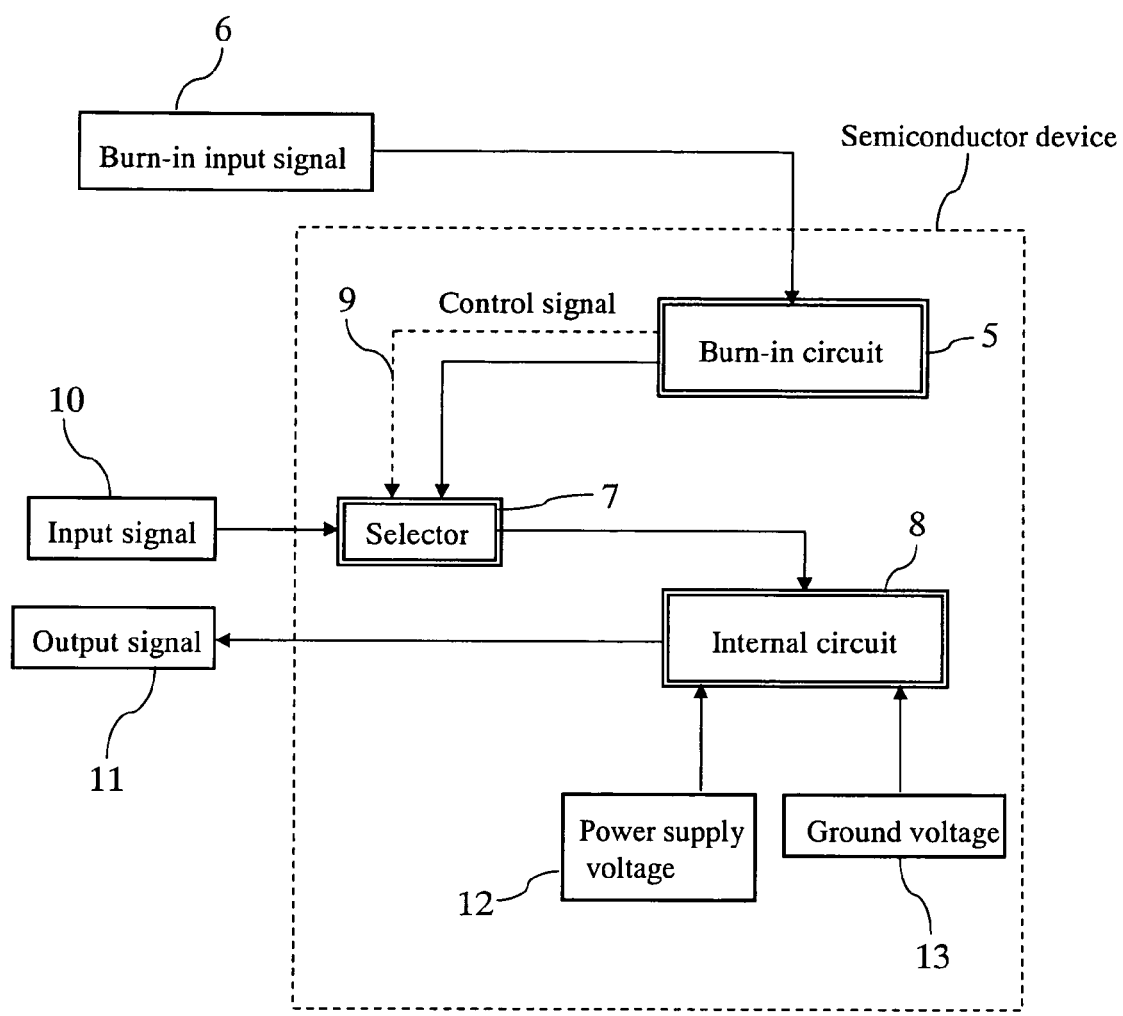
FIG. 3 is a diagram illustrating the operation of a semiconductor device under a burn-in test according to the present invention.

FIG. 3 is a diagram illustrating the operation of a semiconductor device under a burn-in test.

Referring to FIG. 3, a burn-in input signal 6 input to a burn-in circuit 5 is delivered to an internal circuit 8 through a selector 7. In response to a control signal 9 from a burn-in circuit 5, the selector 7 selects either the burn-in input signal 6 or an input signal 10 for operating the internal circuit 8. In a burn-in test, a portion of an output signal 11 is monitored to determine the degree of degradation of the internal circuit 8.

The present embodiment does not use the terminals for the input signal 10 and most of the terminals for the output signal 11 during the burn-in test. Furthermore, the burn-in test has no use for the reinforcing terminals (not shown) for providing mechanical strength to the semiconductor device. That is, the socket 1 has fewer contact pins than there are terminals on the semiconductor device.

Specifically, the present embodiment performs a burn-in test using only the terminals for the burn-in input signal 6, some of the terminals for the output signal 11, and the terminals for a power supply voltage 12 and a ground voltage 13. Therefore, the socket 1 only needs to have contact pins for connection to these terminals. Thus, the socket 1 has fewer contact pins than conventional sockets that must have contact pins corresponding one-to-one to all terminals of the semiconductor device. Therefore, the present invention allows one to reduce the cost of the socket, as well as to reduce the number of through-holes in the burn-in board, facilitating manufacture of the burn-in board. It should be noted that according to the present invention the number of through-holes through which the contact pins are passed may be set equal to the number of contact pins.

Figure 4:
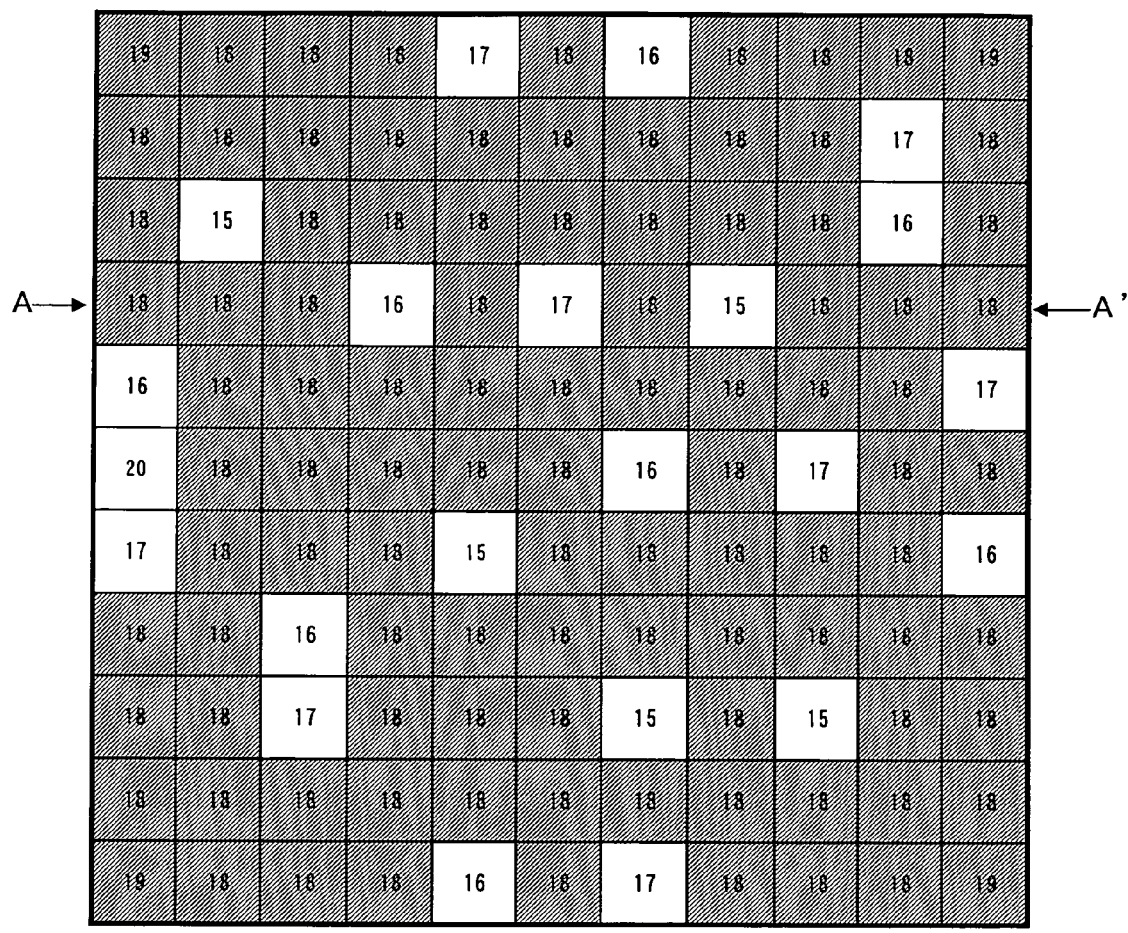
FIG. 4 is a diagram showing an exemplary arrangement of terminals provided on a semiconductor device according to the present invention.

FIG. 4 is a diagram showing an exemplary arrangement of the terminals provided on a semiconductor device. In this example, there are five burn-in signal input terminals 15, eight power supply terminals 16, eight ground terminals 17, and ninety-six (96) input/output terminals 18. Furthermore, non-connecting terminals 19 for device mounting are provided at the four corners. It should be noted that according to the present embodiment the above input/output terminals may be replaced by dedicated input terminals and dedicated output terminals.

When the semiconductor device is actually used as an electronic component, it is fixed to a wiring board, such as a motherboard, through the solder balls. (That is, the semiconductor device is electrically and mechanically connected to the wiring board.) As a result, the terminals at the four corners of the semiconductor device undergo very high stress and may be damaged more easily than the other terminals. Therefore, these terminals are preferably assigned a relatively unimportant function, so that even if they are damaged, it does not affect the functions of the semiconductor device very much. Examples of such terminals include: non-connecting terminals (used in the present embodiment), which are not electrically connected to the semiconductor chip; and ground terminals and power supply potential terminals, which are connected to other terminals by wires in the wiring substrate.

Conventionally, the socket must have contact pins for connection to all the terminals shown in FIG. 4. Furthermore, the burn-in board must have through-holes corresponding one-to-one to the contact pins. However, according to the present invention, the socket only needs to have contact pins for connection to the burn-in signal input terminals 15, the power supply terminals 16, the ground terminals 17, and monitoring output terminals 20. That is, it is not necessary to connect contact pins to the input/output terminals 18 and the non-connecting terminals 19 (shaded in FIG. 4). Therefore, the socket may have fewer contact pins than conventional sockets, facilitating manufacture of the socket and the substrate.

With the exemplary terminal arrangement shown in FIG. 4, the burn-in test may be performed by connecting contact pins to only the particular twenty-two (22) of the 121 terminals provided on the semiconductor device. On the other hand, conventionally, contact pins were connected to all of the 121 terminals. This means that the present invention allows one to reduce the number of contact pins by 80% or more.

Further, in FIG. 4, one of the input/output terminals 18 may be used as a monitoring output terminal 20. Specifically, in a burn-in test, an input/output terminal may be used as a monitoring output terminal, and the degree of degradation of the internal circuit may be determined based on the output signal from the monitoring output terminal. It should be noted that a plurality of monitoring output terminals may be used, instead of just one, depending on the specifications of the device and the conditions of the burn-in test.

Figure 5:
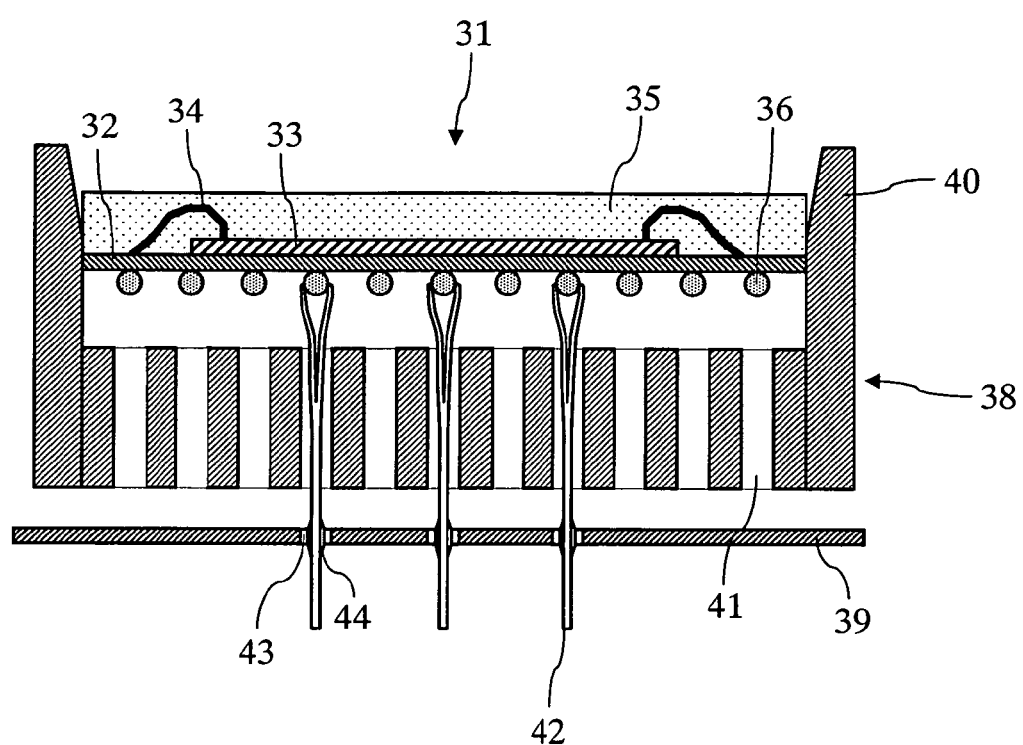
FIG. 5 is a cross-sectional view taken along line A-A' of FIG. 4.

FIG. 5 is a cross-sectional view taken along line A-A' of FIG. 4.

Referring to the figure, a semiconductor device 31 includes: a wiring substrate 32; a semiconductor chip 33 disposed on the wiring substrate 32; bonding wires 34 electrically connecting between the wiring substrate 32 and the semiconductor chip 33; a resin sealing portion 35 sealing the semiconductor chip 33 and the bonding wires 34; and solder balls 36 formed on the rear surface of the wiring substrate 32 and electrically connected to the semiconductor chip 33 through the wires within the wiring substrate 32 and the bonding wires 34 and functioning as external terminals of the semiconductor device 31.

Further, the burn-in device includes: a socket 38 for holding the semiconductor device 31; and a burn-in board 39 electrically connected to the semiconductor device 31 through the socket 38. The socket 38 includes: a resin housing 40; a plurality of through-holes 41 formed in the resin housing 40; and a plurality of contact pins 42 disposed within the through-holes 41 and electrically connected to the solder balls 36.

The contact pins 42 are not limited to a particular shape. However, they are preferably shaped so as to be able to maintain contact with the solder balls 36 by exerting a pinching action on them, since such contact with the solder balls 36 produces a reduced contact dent on these solder balls (as compared to the case where the contact pins are pressed against the undersurface of the solder balls). This results in a reduction in defects at the visual inspection step.

The number of contact pins 42 is set equal to the number of solder balls used in the burn-in test (in the example of FIG. 4, twenty-two (22) contact pins 42). It should be noted that FIG. 5 shows only three of these contact pins 42. Each contact pin 42 is electrically connected to the electrode 43 in a respective through-hole formed in the burn-in board 39. These contact pins 42 are fixed by solder 44.

On the other hand, as described above, the socket has no contact pins corresponding to solder balls other than those used for power voltage supply or signal input/output in the burn-in test, as shown in FIG. 4. (In the above example, ninety-nine (99) of the 121 solder balls are not used in the burn-in test.) Furthermore, the burn-in board has no through-holes corresponding to these solder balls, as shown in FIG. 5. This arrangement allows one to form various wiring patterns in the portions of the burn-in board corresponding to solder balls other than those used for power voltage supply or signal input/output in the burn-in test, increasing the degree of freedom in the design of the burn-in board.

It should be noted that the socket housing 40 has through-holes 41 corresponding one-to-one to all solder balls 36 including those not used for power voltage supply or signal input/output in the burn-in test. The socket housing 40 of the present embodiment is not limited to this particular arrangement. However, the socket housing 40 configured as described above has increased versatility, since it has through-holes 41 to accommodate contact pins 42 corresponding one-to-one to all solder balls 36, as shown in FIG. 5.

Referring back to FIG. 1, an electrical characteristic test is carried out at step 7 after the completion of the burn-in test at step 6.

Figure 6:
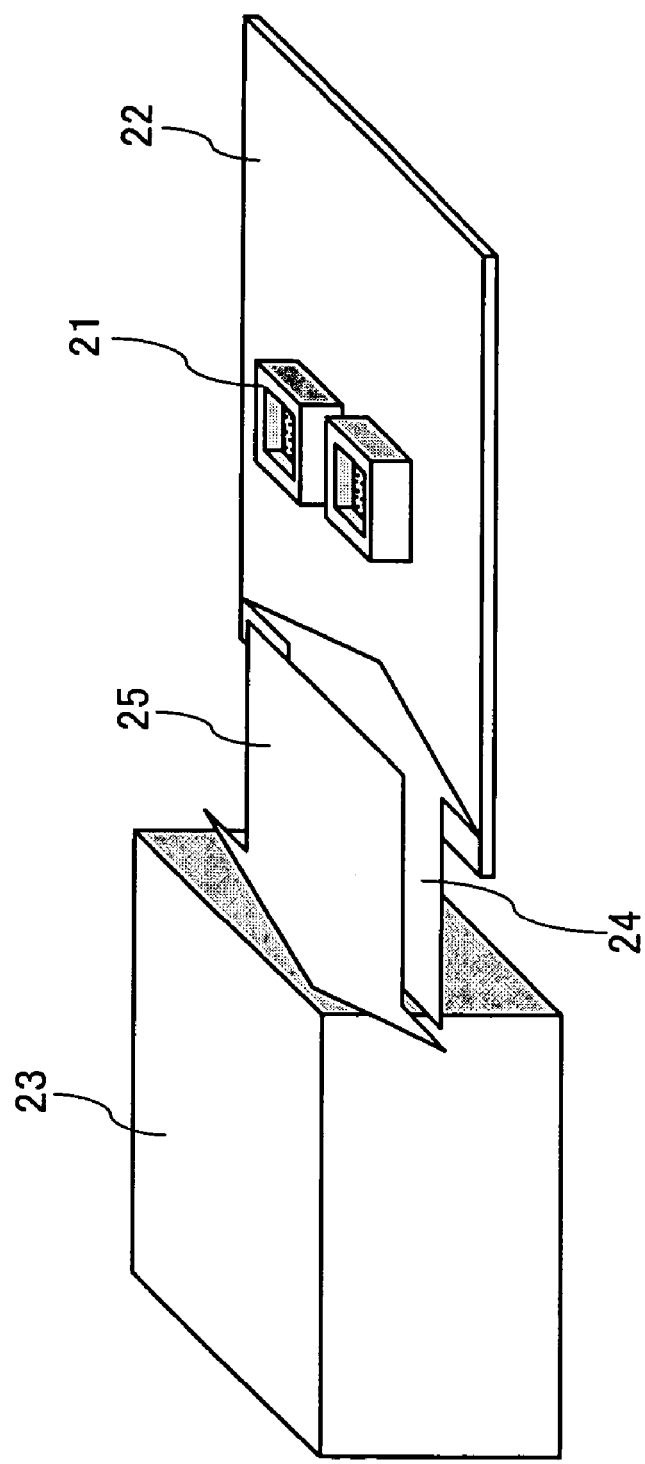
FIG. 6 shows an exemplary electrical characteristic test device according to the present invention.

FIG. 6 shows an exemplary electrical characteristic test device. Each socket 21 in the figure is a second socket of the present invention.

Referring to FIG. 6, a test input signal 24 is supplied from an IC tester 23 to a test substrate 22 having sockets 21 thereon mounted. Therefore, the electrical characteristics of semiconductor devices (not shown) can be examined by connecting them to these sockets 21 and measuring an output signal 25 from the devices by use of the IC tester 23. It should be noted that the sockets 21 may be of a pogo pin type to facilitate manufacture of the test substrate 22.

Specifically, referring to FIG. 3, the input signal 10 is supplied through the selector 7 to the internal circuit 8 to which the power supply voltage 12 and the ground voltage 13 are being applied. Then, the output signal 11 from the internal circuit 8 is monitored to determine the electrical characteristics of the internal circuit 8.

It should be noted that testing the electrical characteristics of a semiconductor device requires use of each terminal of the device. Therefore, usually, contact pins must be connected to all terminals of the device in the electrical characteristic test. (In the burn-in test, contact pins need to be connected to only particular terminals.) In the case of BGA packages, however, non-connecting terminals for device mounting are often disposed at the four corners of the substrate. In such a case, it is possible to eliminate the contact pins corresponding to these non-connecting terminals of the semiconductor device.

That is, (also in the electrical characteristic test) the present embodiment allows one to use sockets (21) having fewer contact pins than there are terminals on the semiconductor device. It should be noted that it is possible to eliminate any contact pin in the socket 21 if it corresponds to a terminal that is not involved in the operation of the semiconductor device, including the non-connecting terminals of a BGA package, as described above.

Figure 7:
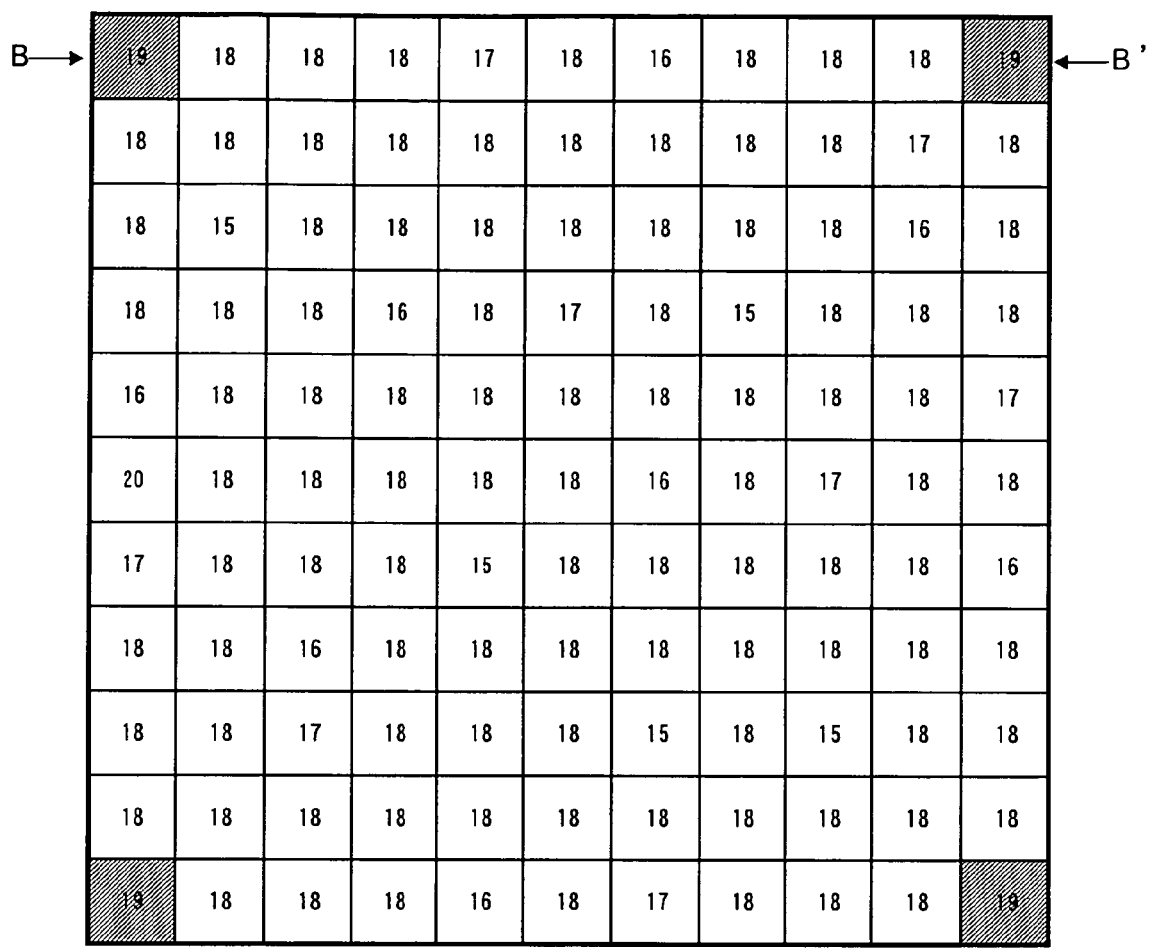
FIG. 7 shows an exemplary arrangement of terminals provided on a semiconductor device according to the present invention.

FIG. 7 is a diagram showing an exemplary arrangement of the terminals provided on a semiconductor device. The terminals to which no contact pins are connected in the test process are shaded in the figure. Specifically, in the test process, contact pins of the socket are connected to all terminals of the semiconductor device other than the non-connecting terminals 19 at the four corners.

Figure 8:
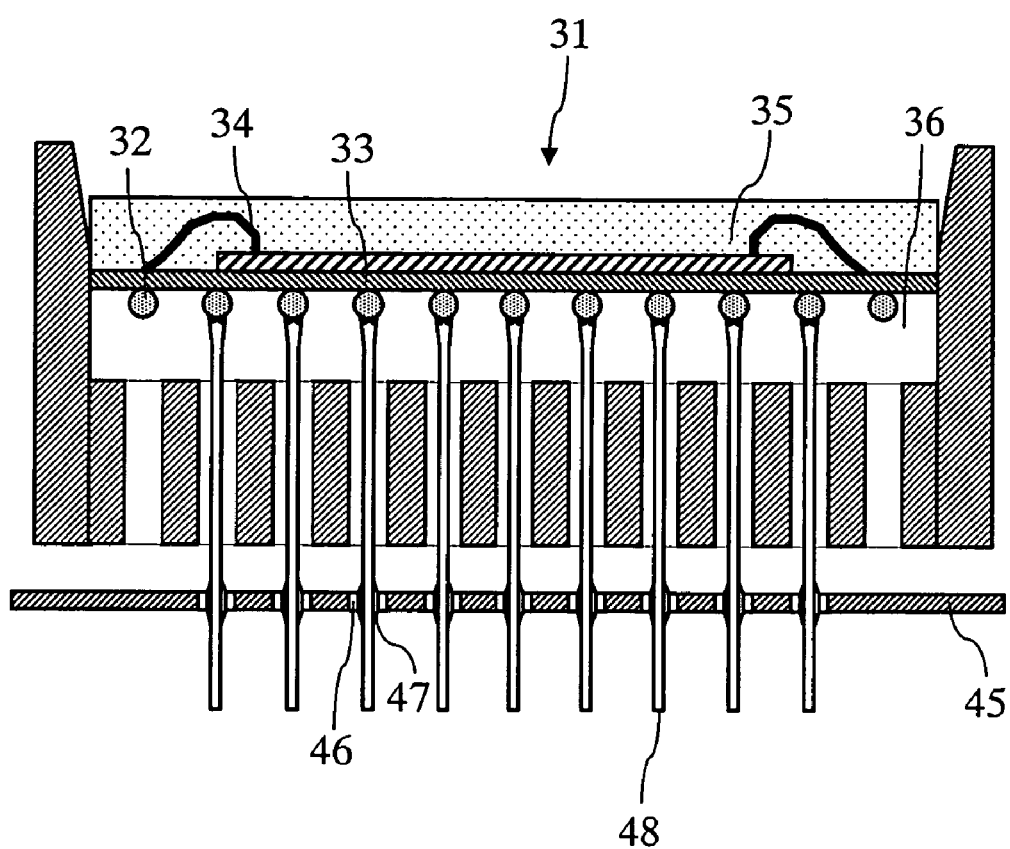
FIG. 8 is a cross-sectional view taken along line B-B' of FIG. 7.

FIG. 8 is a cross-sectional view taken along line B-B' of FIG. 7. It should be noted that in FIG. 8, components common to FIG. 5 are designated by the same reference numerals.

As shown in FIG. 8, no through-holes are provided in the portions of a test board 45 corresponding to the non-connecting terminals 19 (i.e., the solder balls 32 at both ends in the figure). On the other hand, the portions of the test board 45 corresponding to the other terminals have a through-hole. Contact pins 48 are electrically connected to electrodes 46 in these through-holes and fixed by solder 47. The contact pins 48 are also connected to the solder balls 36 formed on the rear surface of the wiring substrate 32.

Figure 9:
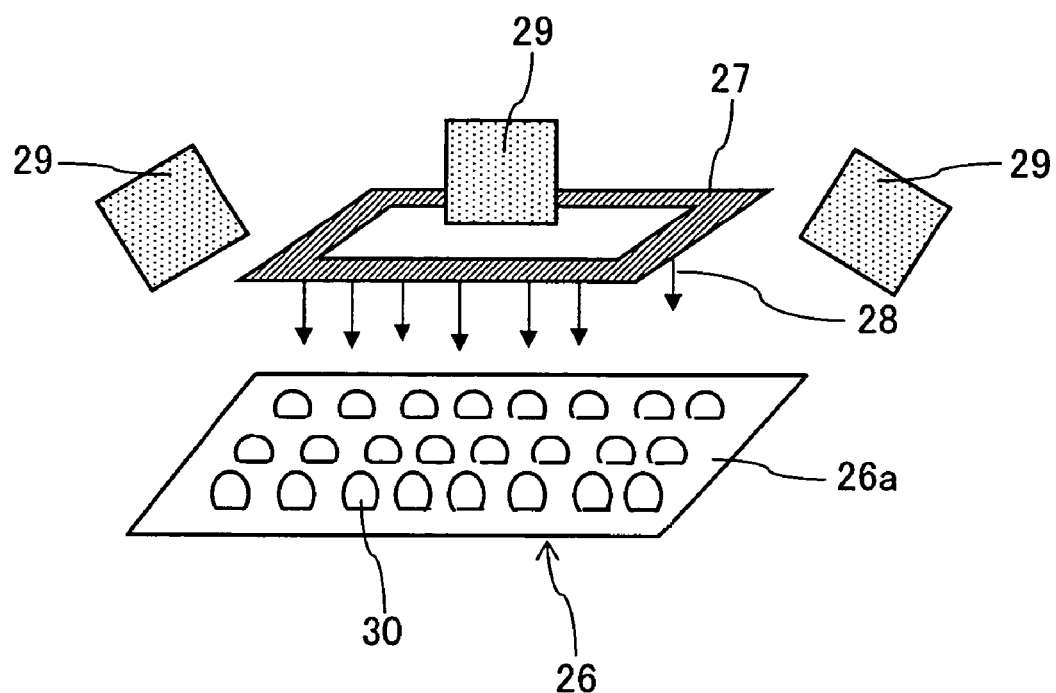
FIG. 9 shows a visual inspection of a semiconductor device according to the present invention.

Referring back to FIG. 1, visual inspection is carried out at step 8 after the completion of the electrical characteristic test. For example, as shown in FIG. 9, light 28 is emitted from a light source 27 to a rear surface 26a of a substrate 26 of a BGA package in which a semiconductor device (not shown) is mounted on the substrate 26. The reflected light is captured by a plurality of cameras 29 to measure the flatness of the substrate 26. However, if in the previous burn-in test a contact pin was brought into contact with a solder ball (or bump) 30 provided on the substrate 26, then the solder ball 30 has a contact dent on its surface and hence diffusely reflects light at the visual inspection step. If there are many such solder balls 30 (having a contact dent), it is difficult to accurately measure the flatness of the substrate 26 based on the reflected light captured by the cameras 29, resulting in increased errors.

The present invention can reduce the number of contact pins connected to solder balls in a burn-in test, as compared to conventional arrangements. This leads to a reduction in the number of solder balls having a contact dent and hence a reduction in measurement errors. It should be noted that these contact pins are preferably of the type that maintains electrical contact with the solder balls by exerting a pinching action on them.

Further, the visual inspection step requires accurate determination of the positions of the solder balls 30 at the four corners of the semiconductor device (see FIG. 9). The reason for this is that accurate measurement of the positions of the solder balls 30 at the four corners allows one to properly determine the warpage and distortion of the entire semiconductor device. According to the present invention, the burn-in test step and/or the electrical characteristic test step uses a socket that does not have contact pins for contact with the solder balls 30 at the four corners, preventing formation of a contact dent on the surface of the solder balls 30 at the four corners and hence preventing erroneous recognition at the visual inspection step.

After the steps 1 to 8 have been completed, the semiconductor devices found to be nondefective are shipped (see FIG. 1).

It should be noted that the present embodiment may include a mode setting feature for burn-in testing of a semiconductor device. For example, if the mode setting requires only a fixed voltage as an external input signal, a pull-up or pull-down resistance with a disconnecting circuit may be connected to the input buffer of the semiconductor device. This arrangement allows electrical charge to be supplied from a power supply terminal or ground terminal in the burn-in test, resulting in a further reduction in the number of terminals used in the burn-in test.

Incidentally, different types of custom semiconductor devices usually have different terminal arrangements but their packages may be common. In such a case, it is preferable that these semiconductor devices have a common input terminal layout for the test circuit, as well as a common power supply and ground terminal layout whenever possible. However, there may be restrictions such as: the ground terminal or input terminal cannot be used as the power supply terminal; the power supply terminal or input terminal cannot be used as the ground terminal; and the power supply terminal or ground terminal cannot be used as the input terminal. The circuit design must take into account such restrictions (if any).

It should be noted that the present invention is not limited to the embodiments described above, and various alterations may be made thereto without departing from the spirit and scope of the invention.

The features and advantages of the present invention may be summarized as follows.

The present invention allows one to perform a burn-in test by use of a socket having fewer contact pins than there are terminals on the semiconductor device to be tested, thus providing a method for manufacturing a semiconductor device at low cost. Further according to the present invention, the contact dents on the solder balls can be reduced to reduce measurement errors in the visual inspection process.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-102339, filed on Mar. 31, 2005 including specification, claims, drawings and summary, on which the Convention priority of the present application is based, are incorporated herein by reference in its entirety.

What is claimed is:

1. A method for manufacturing a semiconductor device, comprising the steps of:
   arranging a semiconductor device, a burn-in test device, and a burn-in board so as to be able to test said semiconductor device by use of said burn-in test device and said burn-in board, wherein said burn-in board has a first socket having fewer contact pins than there are terminals on said semiconductor device;
   electrically connecting some of said terminals to said contact pins; and
   supplying a burn-in input signal from said burn-in test device to said semiconductor device to perform a burn-in test.

2. The method for manufacturing a semiconductor device according to claim 1, wherein:
   said burn-in board has through-holes through which said contact pins are passed; and
   the number of through-holes is smaller than the number of terminals on said semiconductor device.

3. The method for manufacturing a semiconductor device according to claim 1, wherein said semiconductor device includes a test circuit used for said burn-in test.

4. The method for manufacturing a semiconductor device according to claim 3, wherein said test circuit is a disconnectable pull-up resistance or pull-down resistance provided in an output buffer of said semiconductor device.

5. The method for manufacturing a semiconductor device according to claim 1, wherein the number of contact pins is equal to the sum of the numbers of burn-in input terminals, power supply terminals, ground terminals, and monitoring output terminals provided on said semiconductor device.

6. The method for manufacturing a semiconductor device according to claim 1, further comprising the steps of:
   after the completion of said burn-in test, arranging an electrical characteristic test device and a test substrate so as to be able to test said semiconductor device by use of said electrical characteristic test device and said test substrate, wherein said test substrate has a second socket having fewer contact pins than there are terminals on said semiconductor device;
   electrically connecting some of said terminals to said contact pins of said second socket; and
   supplying an input signal from said electrical characteristic test device to said semiconductor device to perform an electrical characteristic test.

7. The method for manufacturing a semiconductor device according to claim 6, wherein said contact pins of said second socket are of a pogo pin type.

8. The method for manufacturing a semiconductor device according to claim 1, wherein said semiconductor device is mounted on a substrate so as to form a BGA package.

9. The method for manufacturing a semiconductor device according to claim 8, wherein said contact pins maintain electrical contact with bump electrodes provided on said substrate by exerting a pinching action on them.

10. The method for manufacturing a semiconductor device according to claim 6, wherein:
    non-connecting terminals are provided at the four corners of said substrate; and
    said first socket has no contact pins for connection to said non-connecting terminals.

11. The method for manufacturing a semiconductor device according to claim 10, wherein said second socket has no contact pins for connection to said non-connecting terminals.

* * * * *